United States Patent
Yin et al.

(10) Patent No.: US 8,735,984 B2
(45) Date of Patent: May 27, 2014

(54) FINFET WITH NOVEL BODY CONTACT FOR MULTIPLE VT APPLICATIONS

(75) Inventors: Chunshan Yin, Singapore (SG); Kian Ming Tan, Singapore (SG); Jae Gon Lee, Singapore (SG)

(73) Assignee: Globalfoundries Singapore PTE, Ltd., Singapore (SG)

( * ) Notice: Subject to any disclaimer, the term of this patent is extended or adjusted under 35 U.S.C. 154(b) by 660 days.

(21) Appl. No.: 12/803,776

(22) Filed: Jul. 6, 2010

(65) Prior Publication Data

US 2012/0007180 A1    Jan. 12, 2012

(51) Int. Cl.
*H01L 21/84*    (2006.01)
*H01L 27/12*    (2006.01)

(52) U.S. Cl.
USPC .... 257/347; 257/368; 257/402; 257/E21.409; 257/E29.263; 438/151

(58) Field of Classification Search
None
See application file for complete search history.

(56) References Cited

U.S. PATENT DOCUMENTS

| | | | | |
|---|---|---|---|---|
| 6,774,437 | B2 * | 8/2004 | Bryant et al. | 257/350 |
| 7,485,520 | B2 * | 2/2009 | Zhu et al. | 438/197 |
| 2002/0151188 | A1 * | 10/2002 | Kamath et al. | 438/769 |
| 2009/0159993 | A1 * | 6/2009 | Jeong | 257/412 |

OTHER PUBLICATIONS

Brews et al., "Transistors", Chapter 24 in "The Electrical Engineering Handbook", Ed. R.C. Dorf, CRC Press 1997, first page of section 24.3.*

* cited by examiner

*Primary Examiner* — Johannes P Mondt
(74) *Attorney, Agent, or Firm* — Robert D. McCutcheon

(57) ABSTRACT

FinFET devices are formed with body contact structures enabling the fabrication of such devices having different gate threshold voltages (Vt). A body contact layer is formed to contact the gate electrode (contact) enabling a forward body bias and a reduction in Vt. Two example methods of fabrication (and resulting structures) are provided. In one method, the gate electrode (silicon-based) and body contact layer (silicon) are connected by growing epitaxy which merges the two structures forming electrical contact. In another method, a via is formed that intersects with the gate electrode (suitable conductive material) and body contact layer and is filled with conductive material to electrically connect the two structures. As a result, various FinFETs with different Vt can be fabricated for different applications.

5 Claims, 6 Drawing Sheets

FINFET WITH NOVEL BODY CONTACT FOR MULTIPLE VT APPLICATIONS

TECHNICAL FIELD

The present disclosure relates generally to the manufacture of semiconductor devices, and more particularly, to the manufacture of a novel Fin field-effect transistor (FinFET).

BACKGROUND

Fin field-effect transistors (FinFET) are multi-gate transistors where the conducting channel is wrapped around a thin piece of silicon, often referred to and configured as a "fin." The dimensions of the fin structure determine the effective channel width of the transistor. Typically, the source, drain and gate are formed extending above the substrate.

FinFETs provide a promising candidate for small line width technology (e.g., approximately 22 nm and below) because of their excellent short channel effect control and scalability. To be advantageous for general purpose applications, it is desirable for FinFETS to have different threshold voltages (Vt) that can be used for different circuit functionalities. However, manufacturing FinFETs with different threshold voltages is difficult. Because the channel or "fin" is on the order of 30 nm, this dimension makes it almost impossible to adjust Vt by changing channel doping concentration.

One possible way to obtain FinFETS with different Vt is to utilize different gate stack materials in High-K-Metal-Gate FinFET technology. However, the use of multiple gate stack processes needed to produce FinFETS with different Vt is extremely complex and non-practical in the manufacturing process.

Another way to obtain different Vt is through body bias. For example, in a conventional surface channel nFET, negative body bias increases Vt while positive body bias lowers Vt. Positive body bias is seldom used in bulk surface channel technology due to its associated high leakage current. Dynamic-Threshold MOSFETS (DTMOS) utilizes positive body bias to dynamically lower Vt when a transistor is "on" in order to increase drive current.

For a conventional FinFET structure, no body contact is possible because the channel/fin is completely isolated by buried oxide (BOX) underneath the channel/fin. Others have proposed to introduce body contact to FinFET structures, however, these methods are either very complicated, non-practical in manufacturing, or the FinFET device characteristics are severely affected.

Accordingly, there is a need for an improved FinFET device and structure (and methods of manufacture) having a gate to body contact that lowers the Vt of the device (as compared to FinFET without gate to body contact).

SUMMARY

In accordance with one advantageous embodiment, there is provided a Fin field-effect transistor (FinFET) device including a substrate formed of insulating material, a fin structure disposed above the substrate, a body layer comprising silicon, the body layer including a first portion disposed underneath at least a portion of the fin structure and a body contact layer of a first conductivity type, and a gate stack including a gate dielectric and a gate electrode, the gate stack formed at least partially around the fin structure and disposed above the body contact layer. The body contact layer is electrically coupled to the gate electrode.

In another embodiment, there is provided a method of manufacturing or fabricating a Fin field-effect transistor (Fin FET). An insulating substrate is provided and a fin structure is formed above the substrate. The method further includes forming a body layer comprising silicon, the body layer including a first portion disposed underneath at least a portion of the fin structure and a body contact layer of a first conductivity type, and forming a gate stack including a gate dielectric and a gate electrode, the gate stack positioned at least partially around the fin structure and disposed above the body contact layer. The body contact layer is electrically coupled to the gate electrode.

In still another embodiment, there is provided a method of manufacturing or fabricating a Fin field-effect transistor (Fin FET). The method includes providing a silicon-on-insulator substrate having a silicon substrate on an insulating layer, and forming a fin structure and a body contact layer by removing a portion of the silicon substrate, the fin structure extending above the body layer. A mask layer is formed on the fin structure and dopants of a first conductivity type are implanted into the body contact layer. A gate stack is formed at least partially around the fin structure and disposed above the body contact layer, with the gate stack comprising a gate dielectric and a gate electrode. Conductive material is formed on the substrate to electrically connect the body contact layer to the gate electrode.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1A:
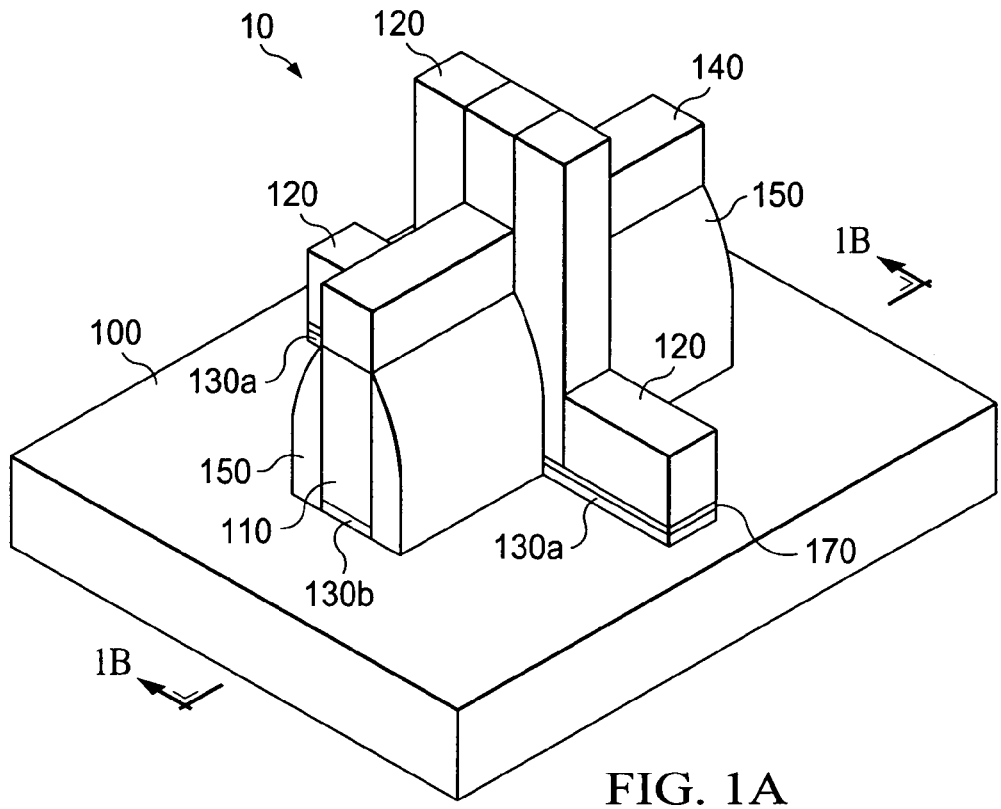
FIGS. 1A and 1B are diagrams illustrating a three-dimensional rendering, and cross sectional side view, respectively, of a FinFET with a body contact structure according to one embodiment of the present disclosure.

The present disclosure describes two different novel body to gate structures for use in FinFET devices, and two methods of manufacturing FinFET devices to form these body contact structures.

Both methods form a body to gate electrode structure, and advantageously allow for the manufacture of such devices without additional masks. These methods form excellent contact between the fin (body) and the gate stack, and can be used for selectively forming the body to gate contact for specific FinFET devices.

FIGS. 1 through 8 and the various embodiments used to describe the principles of the present disclosure in this patent document are by way of illustration only and should not be construed in any way to limit its scope. Those skilled in the art will understand that the principles described herein may be implemented in any type of suitably arranged FET device.

To simplify the drawings, reference numerals from previous drawings will sometimes not be repeated for structures that have already been identified.

Figure 1B:
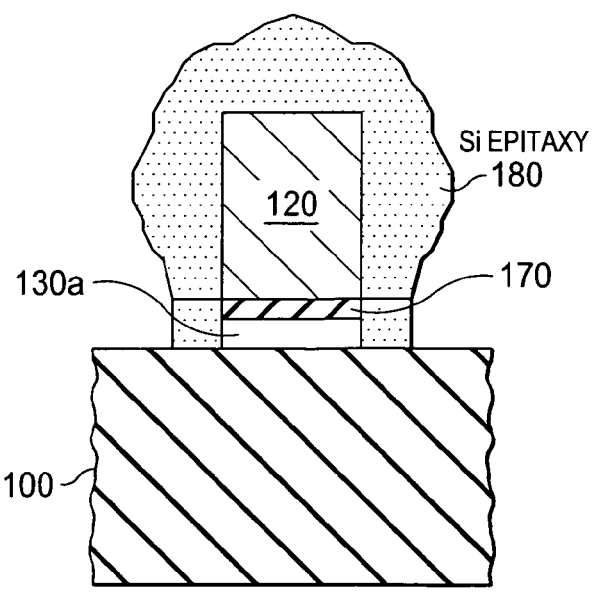

Turning to FIGS. 1A and 1B, these are diagrams illustrating a three-dimensional rendering, and cross sectional side view, respectively, of a FinFET device 10 with a body contact structure according to one embodiment of the present disclosure. As will be appreciated, only the relevant portions of a FinFET device 10 is shown, and the source and drain contacts (and actual gate contact) are not illustrated.

The FinFET device 10 includes a substrate 100 (a silicon substrate may also be added underneath the substrate 100), a fin structure (or channel) 110 disposed above the substrate 100, a gate electrode (or contact) 120 disposed around portions of the fin structure 110, and a body layer 130. The body layer 130 includes a first body contact layer portion 130a and a second portion 130b. The body layer 130 is formed of semiconductor material, and in one embodiment, includes silicon. Substrate 100 may be any type of dielectric or insulating material, and in one embodiment, is formed of silicon oxide, and is sometimes referred to as a buried oxide layer (BOX). In this device 10, the gate electrode 120 is formed of polysilicon or amorphous silicon, and in one specific embodiment is formed of polysilicon.

Though the second portion 130b of the layer 130 is shown as a distinct layer underneath the fin structure 110, it will be understood that this layer may be distinct (a layer formed separately) or may be formed as a part/portion of the fin structure 110.

As shown in FIG. 1A, a dielectric layer 140 is disposed between the fin structure 110 and the gate electrode 120 (above the top surface of the fin structure 110), and the dielectric layer 140 may be a nitride cap layer. A spacer 150 is disposed adjacent the vertical walls of the fin structure 110, as shown. The spacer 150 may be formed of any suitable material, and in one embodiment is formed of silicon dioxide.

With additional reference to FIG. 1B, the body contact layer or structure 130a is disposed between the gate electrode 120 and the buried oxide substrate 100 and is doped to suitably adjust the series resistance of the body contact layer 130a, as desired. Higher dopant concentration will decrease series resistance of the body contact layer 130a, and in one embodiment, the dopant concentration is on the order of $1 \times 10^{20}/cm^3$. The dopants may be of the same conductively type as the dopants in the channel portion of the fin structure 110 (and of a conductivity type opposite the dopants in the source/drain regions of the fin structure 110). In one possible embodiment, the channel portion of the fin structure 110 may be undoped. A gate dielectric 170 is disposed between the gate electrode 120 and the body contact layer 130a, and between the gate electrode 120 and the fin structure 110 (which defines the channel—not shown in FIG. 1A or 1B but shown in FIGS. 5 and 6).

During later processing, a layer of silicon 180 (e.g. epitaxy) is formed on the exposed surfaces of the gate electrode 120 and the body contact layer 130a (and the exposed dielectric 170). As will be appreciated, the sidewall spacers 150 prevent epitaxy from contacting (or forming with) the second portion 130b. FIG. 1B illustrates the silicon epitaxy structure. The gate electrode 120 (and gate dielectric 170) and the body contact layer 130a directly beneath it will merge with the silicon epitaxy 180 during processing and form a body to gate contact (electrical conductive contact) between the body contact layer 130a and the gate electrode 120.

Figure 2A:
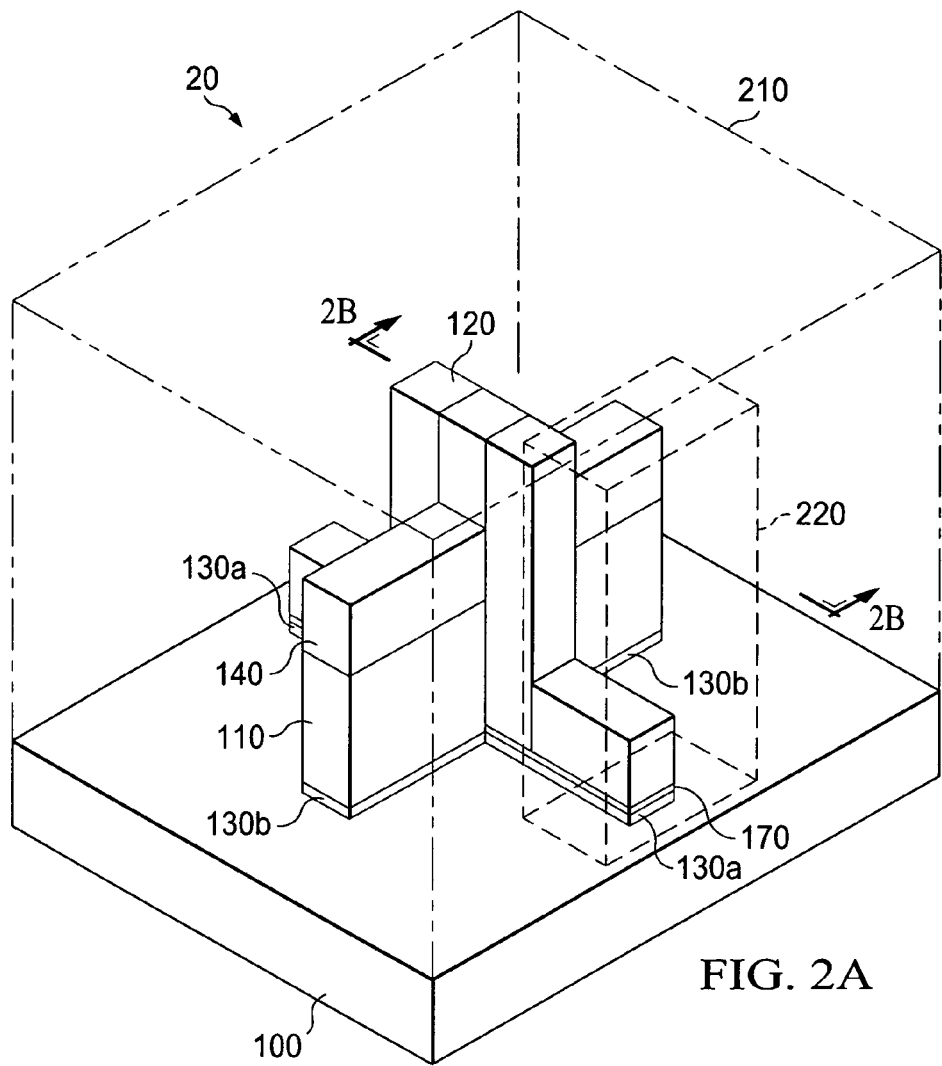
FIGS. 2A and 2B are diagrams illustrating a three-dimensional rendering, and cross sectional side view, respectively, of a FinFET with a body contact structure according to another embodiment of the present disclosure.
Figure 2B:
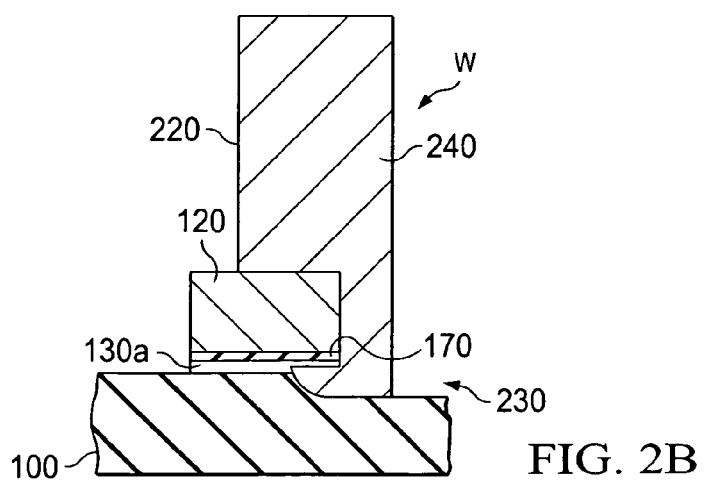

Turning now to FIGS. 2A and 2B, these are diagrams illustrating a three-dimensional rendering, and cross sectional side view, respectively, of a FinFET device 20 with a body contact structure according to another embodiment of the present disclosure. As will be appreciated, only the relevant portions of a FinFET device 20 is shown, and the source and drain contacts (and actual contact to the gate electrode) are not illustrated.

The FinFET device 20 includes the substrate 100, the fin structure (or channel) 110 disposed above the substrate 100, the gate electrode 120 disposed around portions of the fin structure 110, and the body layers 130a, 130b. In one embodiment, the gate electrode 120 is formed of polysilicon or amorphous silicon, but could be formed of other suitable conductive material(s), such as metal or metal alloys.

As shown in FIG. 2A, the dielectric layer 140 is disposed between the fin structure 110 and the gate electrode 120 (above the top surface of the fin structure 110). Spacers are optional. The entire structure is covered with an insulating layer 210 (e.g., inter-level dielectric). The insulating layer 210 is shown as shaded in FIG. 2A to assist in detailing a view of the internal structures, and may be formed of any suitable dielectric material, such as silicon dioxide.

A via 220, positioned as shown in FIG. 2A, is formed in the insulating layer 210 to expose at least portions of the gate electrode 120, the buried oxide substrate 100 and the body contact layer 130a, respectively. During processing, an undercut 230 is formed underneath an edge of the gate stack where a portion of the buried oxide substrate 100 is removed. The via 220 is filled with a suitable conductive material(s) known to those skilled in the art to enable electrical/conductive contact between the gate electrode 120 and the body contact layer 130a. See, FIG. 2B. In one embodiment, the via 220 is filled with a barrier layer (not shown), such as titanium/titanium nitride (Ti/TiN), and a conductive material 230, such as tungsten (W). Other suitable materials may be utilized.

FIGS. 3 through 7 are diagrams that illustrate a series of steps of one embodiment of a method or process for manufacturing the FinFET device 10 (shown in FIGS. 1A and 1B).

Figure 3:
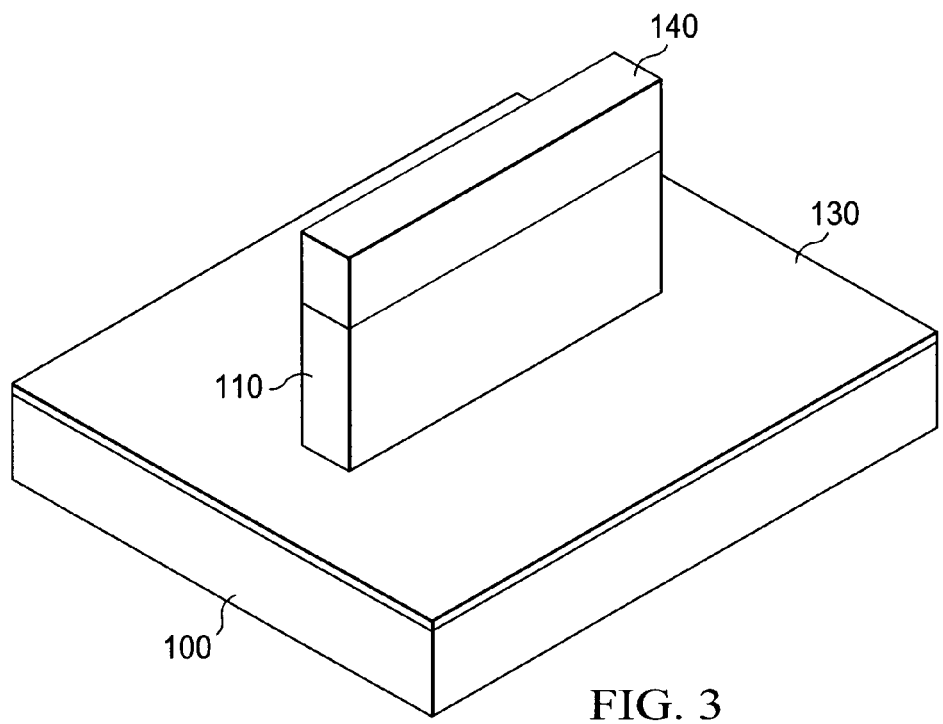
FIGS. 3 through 7 are diagrams that illustrate a series of steps of one embodiment of a method or process for manufacturing the FinFET device shown in FIG. 1A.

Now turning to FIG. 3, after the oxide substrate 100 is provided (usually formed of a silicon-on-insulator (SOI) substrate with oxide formed on the silicon), a layer of semiconductor material, such as silicon, is formed on the oxide substrate 100. The silicon layer is selectively removed to form the fin structure 110 and a thin layer of silicon remains on top of the substrate 100 (and underneath the fin structure 110) which will eventually form the body layers 130a, 130b. The dielectric layer 140, such as a nitride cap layer, is formed above the top surface of the fin structure 110 (usually with an oxide buffer layer therebetween)—usually deposited before Fin patterning.

Figure 4:
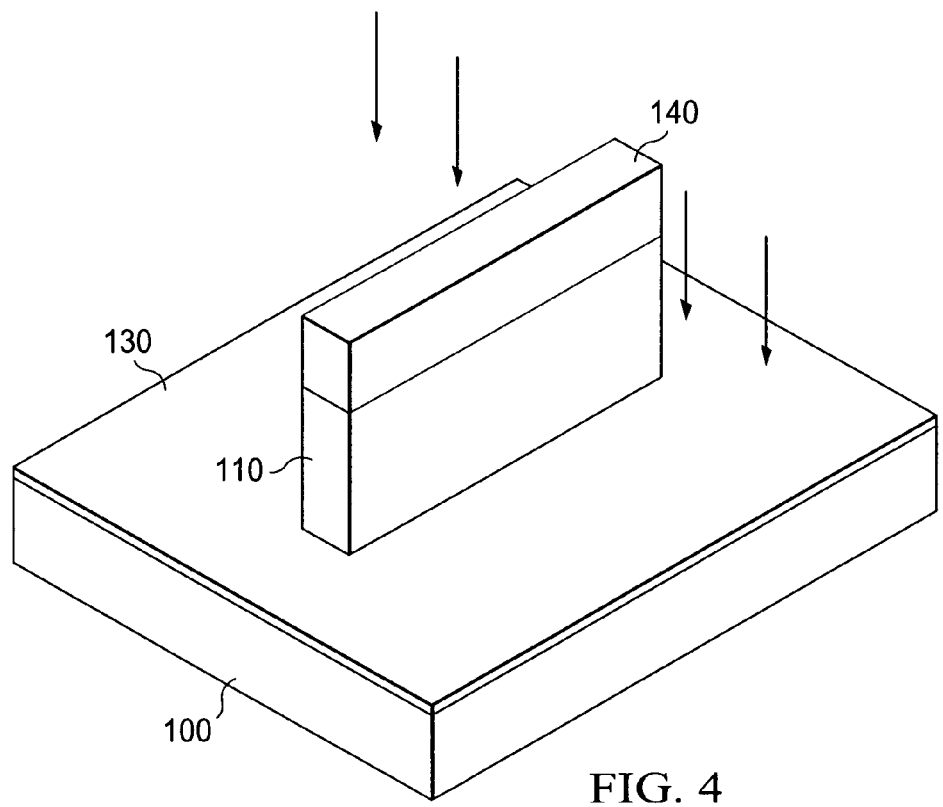

Now turning to FIG. 4, dopants are introduced into the exposed body contact layer 130 by any suitable process. These dopants have the same conductivity type as dopants disposed within (or to be disposed within) the channel portion of the fin structure 110 (i.e., opposite the conductivity type of dopants introduced into the source/drain regions). In one embodiment, the dopants are implanted at a tilt angle of zero degrees so the fin structure 110 is not doped during this implantation process. Dopants in the channel portion of the fin structure 110, if desired, may be introduced by any suitable process (and time) and may be implanted either before formation of layer 140 through a small tilted implantation process or after fin etching through a large angle tilted implantation process. Though not shown in FIG. 4, after doping the gate dielectric layer 170 (e.g., silicon oxide) is formed over exposed silicon areas.

Figure 5:
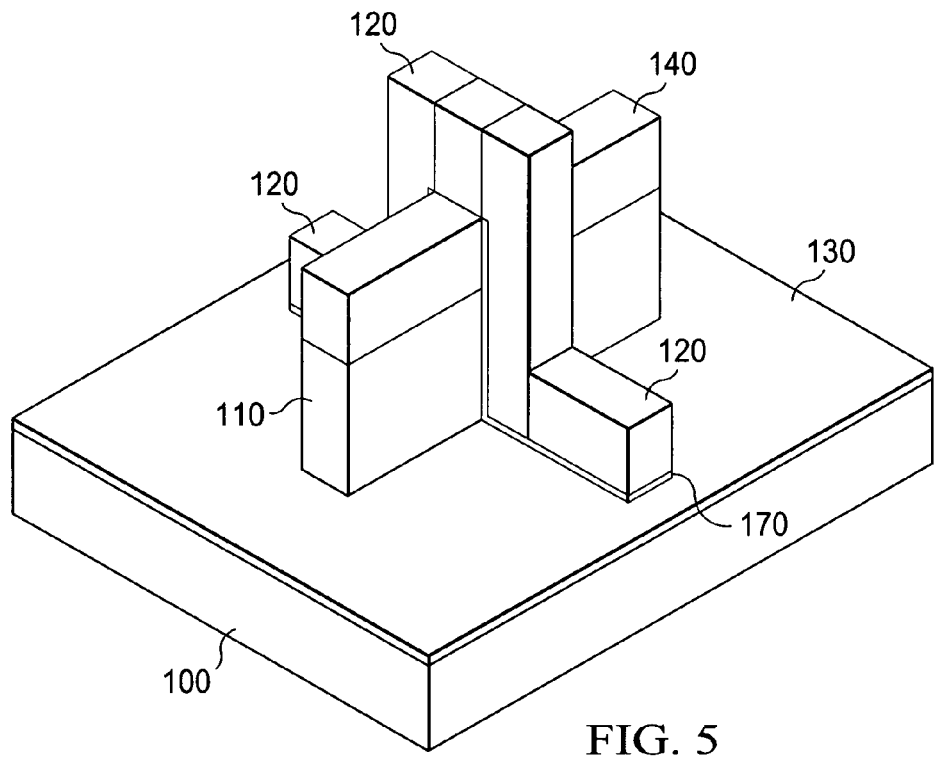

Now turning to FIG. 5, the gate electrode 120 is formed above the dielectric layer 170, as shown. In this embodiment, the gate electrode 120 is formed of polysilicon or amorphous silicon. The gate contact layer 120 and gate dielectric 170 are commonly referred to as a "gate stack".

Figure 6:
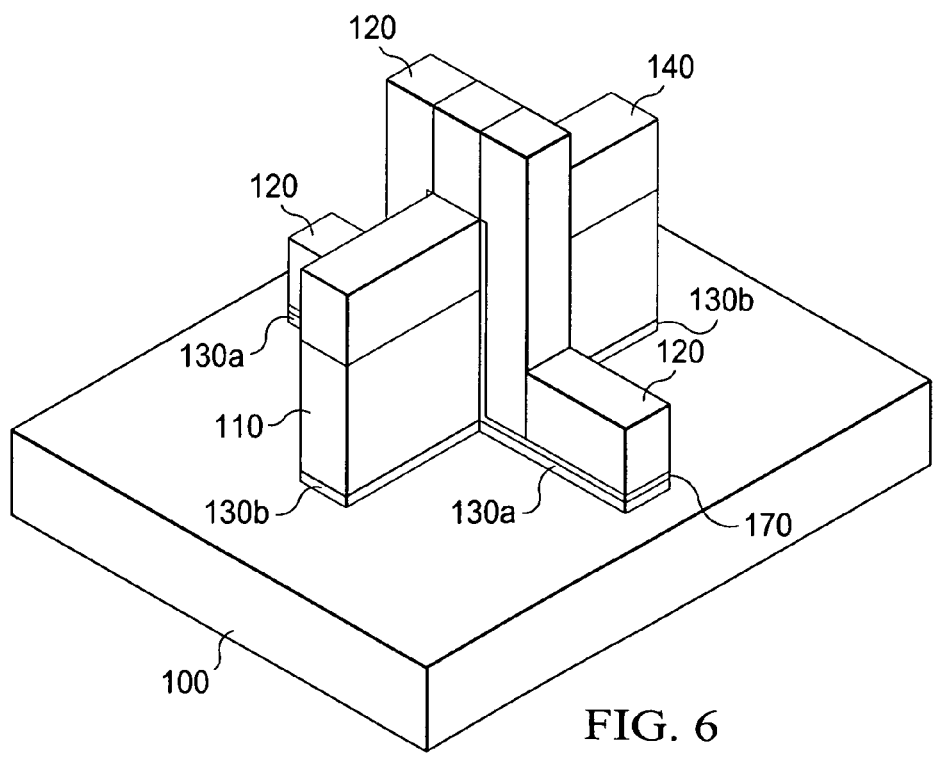

Now turning to FIG. 6, the patterned gate stack may be used as a hard mask during an etch process removing the exposed dielectric layer 170 and then the exposed body contact layer 130 down to the buried oxide substrate 100, resulting in the structure shown in FIG. 6. At this stage, the original body layer 130 is completely etched away except for those portions 130a under the gate stack (and the portion 130b under the fin structure 110).

Figure 7:
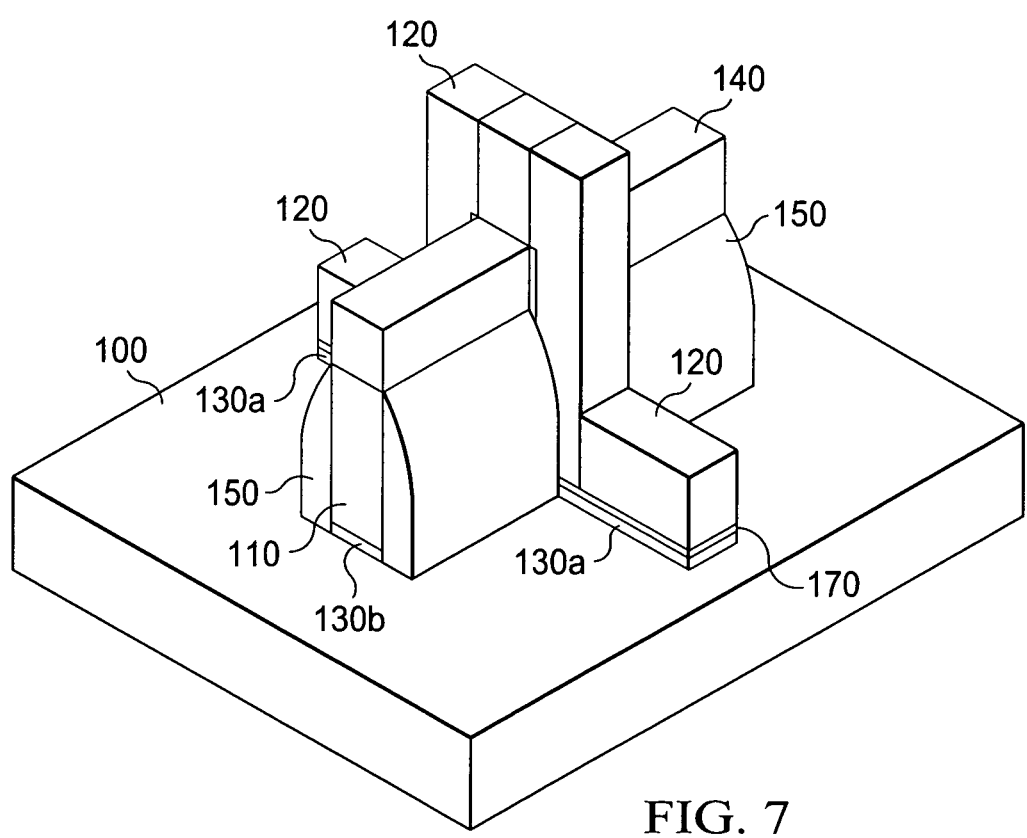

Now turning to FIG. 7, oxide is deposited over the structure and etched away forming sidewall spacers 150 that isolate the walls of the fin structure 110 (and its underlying portion 130b). In one embodiment, the cap layer 140 is formed having a thickness greater than the thickness of the gate electrode 120 and with a controlled etch time the spacers 150 will form only on the vertical sidewalls (the oxide must be removed to a level that exposes the layer 130a to allow the epitaxy to connect 130a with 120). The resulting structure is shown in FIG. 7. Now the sidewalls of the layers 130a and 120 are both exposed.

Next, a silicon epitaxy process is performed to form the silicon epitaxy layer 180, which is formed on the gate electrode 120 and the exposed surfaces of the body contact layer 130a and the gate dielectric 170. During this process, the polysilicon (or amorphous silicon, when initially formed) gate electrode 120 and body contact layer 130a merge to form a body-to-gate contact. Either single crystal silicon or polysilicon (or both) can be used to seed the epitaxy. As described earlier, this process and structure result in a lower Vt for the FinFET device 10. When the gate electrode 120 and body contact layer 130a merge or connect, the body contact layer 130a and fin structure 110 will receive positive bias (for an nFET) when the device turns on (i.e., Vg increases) and this will reduce Vt. The resulting structure is shown in FIGS. 1A and 1B.

FIGS. 3-6 and 8 are diagrams that illustrate a series of steps of another embodiment of a method or process for manufacturing the FinFET device 20 (shown in FIGS. 2A and 2B). As will be appreciated, this method or process includes the same steps or processes described with respect to FIGS. 3-6, except that the gate electrode 120 may be formed of any conductive material(s). Therefore, the description herein will begin with the structure as shown in FIG. 6.

Figure 8:
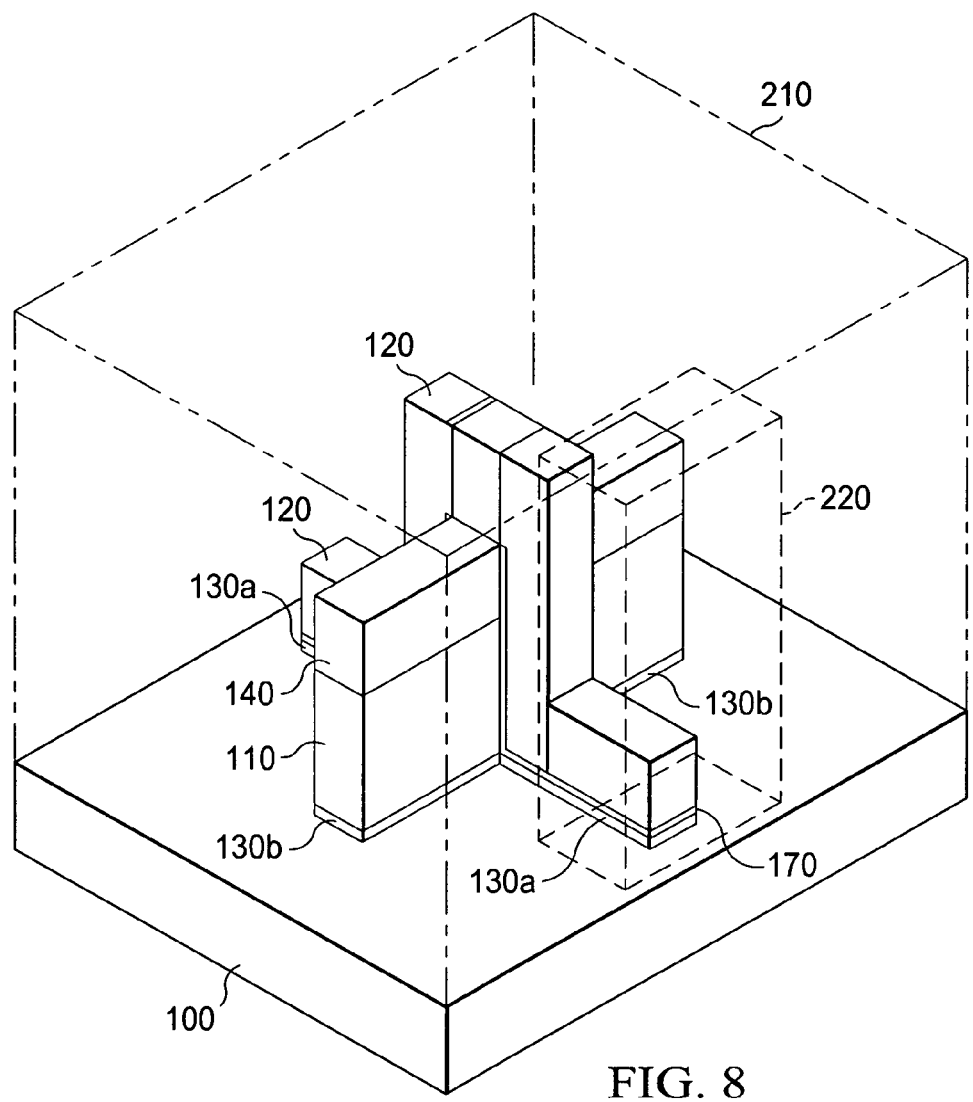
FIG. 8 (in conjunction with FIGS. 3-6) are diagrams that illustrate a series of steps of another embodiment of a method or process for manufacturing the FinFET device shown in FIG. 2A.

With reference to FIG. 6, and now turning to FIG. 8, The structure shown in FIG. 6 may be processed with source/drain implantation, dopants activation, silicidation, inter-level dielectric (ILD) formation and chemical mechanical polishing (CMP) to result in the insulating layer 210 (e.g., inter-level dielectric) as shown in FIG. 8. The insulating layer 210 is shown as shaded in FIG. 8, and may be formed of any suitable dielectric material, such as silicon dioxide.

The via 220, positioned as shown in FIG. 8, is formed through the insulating layer 210 to expose at least portions of the gate electrode 120, the buried oxide substrate 100 and the body contact layer 130a, respectively. See, also FIG. 2B. During processing, an undercut 230 is formed underneath an edge of the gate stack where a portion of the buried oxide substrate 100 is removed. This may be achieved through etching using a hydrofluoric acid (HF) dip (etch), or other suitable process.

The via 220 is then filled with any suitable conductive material(s) known to those skilled in the art to enable electrical/conductive contact between the gate electrode 120 and the body contact layer 130a. See, FIG. 2B. In one embodiment, the via 220 (and undercut 230) is filled with a barrier layer (not shown), such as Ti/TiN, and conductive material 240, such as tungsten (T). Other materials may be utilized. Formation of the undercut 230 beneath the body contact layer 130 increases surface contact to the via 220 barrier layer and conductive material.

It will be understood that well known processes have not been described in detail and have been omitted for brevity. Although specific steps, structures and materials may have been described, the present disclosure may not limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A Fin field-effect transistor (FinFET) device comprising:
   a substrate formed of insulating material;
   a fin structure disposed above the substrate;
   a body layer comprising silicon, the body layer including a first portion disposed underneath at least a portion of the fin structure and including a body contact layer portion having dopants of a first conductivity type;

a gate stack including a gate dielectric and a gate electrode, wherein the gate electrode comprises silicon, the gate stack formed at least partially around the fin structure and disposed above the body contact layer portion;

a dielectric material overlying the body contact layer portion and the gate stack;

a via formed through the dielectric material for exposing at least portions of the body contact layer portion and the gate electrode;

first conductive material disposed within the via for electrically coupling the body contact layer portion and the gate electrode; and wherein the via is wider than a width of the gate stack and a portion of the first conductive material is disposed beneath the body contact layer portion.

2. The FinFET device in accordance with claim 1 wherein the gate electrode comprises conductive material.

3. The FinFET device in accordance with claim 1 wherein the fin structure comprises:

a channel portion having dopants of the first conductivity type;

a first source/drain (S/D) region having dopants of a second conductivity type; and a second S/D region having dopants of the second conductivity type.

4. A method of fabricating a Fin field-effect transistor (FinFET), the method comprising:

providing an insulating substrate;

forming a fin structure above the substrate;

forming a body layer comprising silicon, the body layer including a first portion disposed underneath at least a portion of the fin structure and including a body contact layer portion of a first conductivity type;

forming a gate stack including a gate dielectric and a gate electrode, wherein the gate electrode comprises silicon, the gate stack positioned at least partially around the fin structure and disposed above the body contact layer portion;

forming a dielectric material overlying the body contact layer portion and the gate stack;

forming a via through the dielectric material for exposing at least portions of the body contact layer portion and the gate electrode;

disposing first conductive material within the via for electrically coupling the body contact layer portion and the gate electrode; and wherein the via is formed wider than a width of the gate stack and a portion of the first conductive material is disposed beneath the body contact layer portion.

5. The method in accordance with claim 4 wherein forming the via further comprises:

etching using an acid dip.

* * * * *